United States Patent [19]

Sasaya et al.

[11] 4,425,419

[45] Jan. 10, 1984

[54] PHOTOSENSITIVE COMPOSITION

[75] Inventors: Osamu Sasaya; Masahiro Nishizawa; Hiroshi Yokomizo; Kiyoshi Miura; Yoshifumi Tomita, all of Mobara, Japan

[73] Assignee: Hitachi, Ltd., Tokyo, Japan

[21] Appl. No.: 333,757

[22] Filed: Dec. 23, 1981

Related U.S. Application Data

[63] Continuation of Ser. No. 184,960, Sep. 8, 1980, abandoned.

[30] Foreign Application Priority Data

Sep. 14, 1979 [JP] Japan .............................. 54-117249

[51] Int. Cl.$^3$ .............................................. G03C 1/52
[52] U.S. Cl. ..................................... 430/179; 430/28; 430/177; 430/171; 430/169; 430/631
[58] Field of Search ............... 430/28, 179, 171, 177, 430/169, 631

[56] References Cited

U.S. PATENT DOCUMENTS

| | | | |
|---|---|---|---|
| 2,807,545 | 9/1957 | Frederick | 430/169 |
| 3,779,768 | 12/1973 | Cope et al. | 430/177 |
| 3,811,889 | 5/1974 | Endou et al. | 430/631 |
| 4,273,842 | 6/1981 | Nonogaki et al. | 430/28 |

Primary Examiner—Won H. Louie, Jr.
Attorney, Agent, or Firm—Charles E. Pfund

[57] ABSTRACT

An amphoteric surfactant is added to a photosensitive composition consisting essentially of an aromatic diazonium salt and used to prepare a fluorescent screen of a color picture tube.

4 Claims, 4 Drawing Figures

PHOTOSENSITIVE COMPOSITION

This is a continuation of application Ser. No. 184,960 filed Sept. 8, 1980, abandoned.

BACKGROUND OF THE INVENTION

This invention relates to a photosensitive composition, more particularly a photosensitive composition utilized to form a fluorescent screen on the inner surface of the face plate of a color picture tube by a photostickness method or a dry process.

The dry process was developed to replace a conventional slurry process. According to the dry process, a photosensitive composition consisting essentially of an aromatic diazonium salt is used. When locally exposed to light, a film of this composition manifests a difference in the powder accepting capability between a portion exposed to light and a portion not exposed to light.

According to this method, a film of photosensitive substance is coated on the inner surface of a face plate, and the portions of the film at which phosphors of predetermined colors are to be coated are exposed to light through a color selection electrode such as a shadow mask to utilize a photoreaction created therein for the purpose of coating the phosphors. More particularly, a film of a photosensitive composition containing a diazonium salt as a major constituent is coated on the inner surface of the face plate and the portions of the film at which the phosphors are to be coated are exposed to light. Then, zinc chloride formed in the exposed portions by a photoreaction absorbs moisture in the atmosphere to become sticky, so that when a powder of phosphors for emitting desired fluorescent colors is blasted onto the inner surface of the face plate, the phosphor powder will adhere only to the portions of the photosensitive composition film that has become sticky. After performing blasting and sticky coating of respective phosphors of three colors, the surface of the photosensitive composition film is treated with ammonia gas to render the portions of the photosensitive composition film to which the phosphor powder has been adhered to be insoluble in water, thereby fixing these portions. Then, surface remainders are washed away with an organic solvent thus forming a fluorescent screen. When compared with a conventional method of the slurry type in which phosphors of respective colors are formed as photosensitive slurries which are sequentially coated, exposed, washed with water and developed, this dry process is advantageous in that only one coating step of the photosensitive composition film is sufficient, that it is possible to blast the phosphors in the form of a powder, and that surplus phosphor powders that had not adhered can be flown away with an air spray for recovery purpose, thus increasing the efficiency of utilization of the phosphors. Such dry method is disclosed, for example, in Japanese Preliminary Publication of Patent No. 53-126,861, published on Nov. 6, 1978, invented by Saburo Nonagaki et al, and corresponding to U.S. patent application Ser. No. 895,372 filed on Apr. 1, 1978, U.S. Pat. No. 4,273,842 published on June 16, 1981.

Irrespective if the advantage described above, the photosensitivity of the photosensitive position layer formed by the dry process is lower than that of a layer formed by other prior art method. For this reason with the dry process it is necessary to use longer exposure time or larger amount of exposing light than exposing the layer made by the prior art slurry process. Then light diffusion occurs due to reflections between the inner surface of the face plate and the shadow mask or fogs are formed due to a dark reaction.

SUMMARY OF THE INVENTION

Accordingly, it is an object of this invention to provide a novel photosensitive composition capable of reducing exposure time or quantity of light exposure and preventing formation of fogs.

Further object of this invention is to provide an improved photosensitive composition especially suitable for forming a fluorescent screen of a color picture tube having superior quality than that formed with the prior art dry process.

Briefly stated, according to this invention an ampholytic surfactant is incorporated into a photosensitive composition containing a diazonium salt so as to prevent creation of fogs in a photosensitive composition film, thus improving the sensitivity.

According to this invention there is provided a photosensitive composition containing an aromatic diazonium salt as a major constituent, characterized in that an amphoteric surfactant is added to the photosensitive composition.

According to another aspect of this invention, there is provided a photosensitive composition utilized to prepare a fluorescent screen of a color picture tube, characterized in that the photosensitive composition consists of 3.0% by weight of para-dimethyl aminobenzene ziazonium chloride-zinc chloride double salt, 0.6% by weight of propylene glycol alginate, 0.003% by weight of a surfactant, 0.1% by weight of ethylene glycol, 0.01 to 15% by weight of an amphoteric surfactant and balance of water.

DESCRIPTION OF THE PREFERRED EMBODIMENTS

We have made a number of experiments in which various additives were added to a composition containing a diazonium salt as the photosensitive composition, and used the composition to form fluorescent screens and found that incorporation of an amphoteric surfactant, that is a surfactant containing a radical acting as a cation and a radical acting as an anion in the same molecule into the diazonium salt not only decreases the exposure time or the amount of light exposure but also prevents formation of fogs. As the amphoteric surfactant may be used lauryl betaine, stearyl betaine or alkyl betaine.

To have better understanding of the invention the following examples are given but not construed to limit the scope of the instant invention.

EXAMPLE 1

Figure 1A:
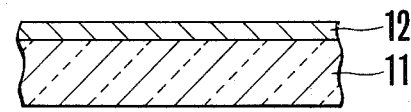
FIGS. 1A through 1D are partial sectional views showing successive steps of forming a fluorescent screen of a color picture tube by using the photosensitive composition according to this invention.

An aqueous solution having the following composition was prepared and applied to the inner surface of the panel or face plate 11 of 14" color picture tube shown in FIG. 1A with a rotary coating process and the resulting photosensitive film 12 was dried by infrared rays to a thickness of about 0.6 micron.

Composition 1

Para-dimethyl aminobenzene diazonium chloride-zinc chloride double salt: 3.0% by weight
Propylene glycol alginate (Kimiroide MV, manufactured by Kimutsu Kagaku Sha): 0.6% by weight
surfactant (Pluronic L-92, manufactured by Wyandotte Chemical Co.): 0.003% by weight
Ethylene glycole: 0.1% by weight
Lauryl betaine (Anbitol 24B, manufactured by Kao Atlas Co.): 0.3% by weight
water: remainder Ultraviolet rays having an intensity of about 18W/m$^2$ and emitted by a ultra high pressure mercury lamp were projected upon a portion of the photosensitive layer 12 to be coated with a green color phosphor through a shadow mask 13 for about 30 seconds. At the portion irradiated with ultraviolet rays, the diazonium salt in the photosensitive layer undergoes photodecomposition to form a substance capable of accepting a powder.

Figure 1B:
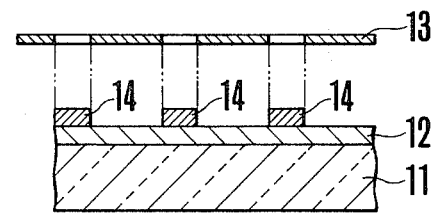

Then a powder of a green color phosphor 14 was dusted on the surface of the photosensitive layer. More particularly, after sprinkling the powder of the phosphor to cause the powder to adhere to the exposed portion of the photosensitive film, the surplus phosphor powder was removed by an air spray. This state is shown in FIG. 1B.

Figure 1C:
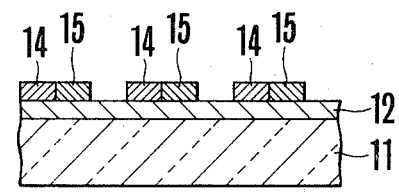
Figure 1D:
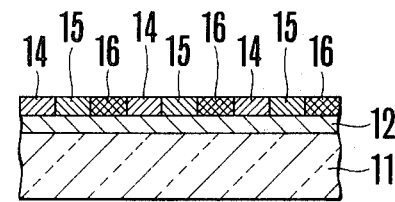

By a similar process step, a second layer 15 of a blue phosphor was formed as shown in FIG. 1C. Then, a third layer 16 of a red phosphor was formed as shown in FIG. 1D. In this manner, phosphors of three colors were formed at positions to be impinged by electron beams adapted for emitting respective colors, thus obtaining a fluorescent screen.

According to the process steps described above phosphor stripes each having a width of 175 to 180 microns were formed. Moreover, formation of fogs was prevented. A photosensitive layer made of a conventional composition, corresponding to the composition 1 except the lauryl betaine requires an irradiation time of about 120 seconds to obtain phosphor stripes of the same width. Incorporation of the lauryl betaine not only decreases the exposure time or the amount of exposure necessary to form phosphor stripes to about ⅔ but also prevents the formation of fogs.

Any aromatic diazonium salt that decomposes when irradiated with light may be used, but in this example a stable diazonium complex salt was used. The propylene glycol alginate, which is a high molecular weight material, is used for the purpose of providing an adhesive coating of uniform thickness. The surfactant pluronic L-92 and ethylene glycol, a low molecular weight material, are also used to obtain homogeneousness.

EXAMPLE 2

An aqueous solution of the following composition was prepared.

Composition 2

Para-dimethyl aminobenzene diazonium chloride-zinc chloride double salt: 3.0% by weight
Propylene glycol alginate: 0.6% by weight
Surfactant (Pluronic L-92): 0.003 by weight
Ethylene glycol: 0.1% by weight
Stearyl butane: 0.3% by weight
(Anbitol 86B, manufactured by Kao Atlas Co.)
Water: remainder The aqueous solution of this composition was coated to obtain a photosensitive layer having a thickness of about 1 micron in the same manner as in Example 1. Light having an intensity of about 18 W/m$^2$ emitted by a ultra high pressure mercury lamp was irradiated upon the photosensitive layer through a shadow mask for about 90 seconds. Then, a powder of a green color phosphor was dusted on the surface of the photosensitive layer to obtain phosphor stripes each having a width of about 180 microns. In the same manner, phosphor layers of blue and red colors were successively formed.

Again, a fluorescent screen free from any fog was obtained. The time necessary to obtain the stripes of the same width by utilizing a photosensitive layer of the prior art composition is about 120 seconds. However, incorporation of stearyl betaine reduces the exposure time or the amount of exposure light necessary to form the phosphor stripes to about ⅔.

EXAMPLE 3

Composition 3

Para-dimethyl aminobenzene diazonium chloride-zinc chloride double salt: 3.0% by weight
Propylene glicol alginate (Kimiroid MV, manufactured by Kimitsu Kagaku Co.): 0.6% by weight
Surfactant (Pluronic L-92, manufactured by Wyandotte Chemical Co.): 0.003% by weight
Ethylene glycol: 0.1% by weight
Alkyl betaine: 0.3% by weight
(Lion Softer, manufactured by Lion Ushi Co. or Anon BF or Anon AT, manufactured by Nippon Yushi Co.)
Water: remainder An aqueous solution of this composition 3 was used in the same manner as in the foregoing examples to form a photosensitive layer which was than used to form a fluorescent screen free from any fog. Again the exposure time or the amount of light exposure was reduced to about ⅔ of the prior art.

EXAMPLE 4

Composition 4

Para-dimethyl aminobenzene diazonium chloride-zinc chloride double salt: 3.0% by weight
Propylene glycol alginate: 0.6% by weight
(Kimiroid MV, manufactured by Kimitsu Kagaku Co.)
surfactant
(Pluronic L-92, manufactured by Wyandotte Chemical Co.): 0.003% by weight
Ethylene glycol: 0.1% by weight
Imidazoline derivatives: 0.3% by weight
(Lion Softer 300, manufactured by Lion Yushi Co., Spanol 700 or Softer 706, manufactured by Nippon Yushi Co.)
Water: remainder By using this composition 4, a photosensitive layer was firstly formed on the inner surface of the panel and then a fluorescent screen was formed in the same manner as in Example 1. It was found that the resulting fluorescent screen was free from any fog and that the exposure time or the amount of light exposure was reduced to about ⅔ of the prior art composition.

Instead of using independently lauryl betaine and stearyl betaine, a mixture thereof can also be used or a mixture of one or both and another surfactant can also be used. When used in a range of from 0.01 to 15% by weight with respect to an aromatic diazonium salt, the amphoteric surfactant not only increases the sensitivity but also prevents fogging.

With less than 0.01% by weight of the amphoteric surfactant it is not possible to increase the sensitivity and prevent fogging, whereas with more than 15% by weight adhesion of the phosphor powder to the photosensitive layer decreases, thus decreasing the mass of the photosensitive layer.

Thus, use of the amphoteric surfactant greatly increases the sensitivity and hence the brightness, adequate range thereof being 0.02 to 11.0% by weight.

As above described, according to this invention, since an amphoteric surfactant is added to the photosensitive composition it is possible to decrease the exposure time or the amount of light exposure necessary to form phosphor picture elements and to prevent formation of fogs thus improving the picture quality.

It should be understood that the invention is not limited to the specific embodiments described above and the many changes and modifications will be obvious to one skilled in the art. For example, in the embodiment shown in FIG. 1, the phosphor pattern is in the form of stripes but the pattern may be in the form of dots.

Further the order of the steps of forming the photosensitive layer is not limited to that described above, any order of steps may be used so long as a phosphor layer enameling red, green and blue colors can be obtained.

What is claimed is:

1. A dry photosensitive layer comprising a photosensitive composition containing an aromatic diazonium salt as a major constituent, characterized in that an amphoteric surfactant is added to said photosensitive composition in an amount of at least 0.01 percent by weight based on the weight of said aromatic diazonium salt and in an amount sufficient to increase the sensitivity and reduce fogging of said composition, wherein said amphoteric surfactant is selected from a group consisting of lauryl betaine, stearyl betaine and alkyl betaine.

2. The photosensitive layer according to claim 1 wherein the amount of said amphoteric surfactant ranges from 0.01 to 15% by weight based on the weight of said aromatic diazonium salt.

3. The photosensitive layer according to claim 1 wherein the amount of said amphoteric surfactant ranges from 0.02 to 11.0% by weight based on the weight of said aromatic diazonium salt.

4. A photosensitive composition utilized to prepare a fluorescent screen of a color picture tube, characterized in that said photosensitive composition consists of 3.0% by weight of para-dimethyl aminobenzene diazonium chloride-zinc chloride double salt, 0.6% by weight of propylene glycol alginate, 0.003% by weight of a surfactant, 0.1% by weight of ethylene glycol, 0.01 to 15% by weight of an amphoteric surfactant based on the weight of said double salt, and balance of water, wherein said amphoteric surfactant is selected from a group consisting of lauryl betaine, stearyl betaine and alkyl betaine, said amphoteric surfactant being present in an amount sufficient to increase the sensitivity and to reduce fogging of the composition.

* * * * *

UNITED STATES PATENT AND TRADEMARK OFFICE
CERTIFICATE OF CORRECTION

PATENT NO. : 4,425,419
DATED : January 10, 1984
INVENTOR(S) : Osamu Sasaya et al It is certified that error appears in the above—identified patent and that said Letters Patent is hereby corrected as shown below:

Column 1, line 63: change "if" to --of--

Column 1, line 64: change "position" to --composition--

Column 2, lines 16-17: change "ampholtic" to --amphoteric--

Column 3, line 66: change "Stearyl butane:" to --Stearyl betaine:--

Signed and Sealed this

Twenty-sixth Day of March 1985

[SEAL]

Attest:

DONALD J. QUIGG

Attesting Officer     Acting Commissioner of Patents and Trademarks